(12) United States Patent
AbuGhazaleh et al.

(10) Patent No.: US 6,796,847 B2
(45) Date of Patent: Sep. 28, 2004

(54) ELECTRICAL CONNECTOR FOR TELECOMMUNICATIONS APPLICATIONS

(75) Inventors: Shadi A. AbuGhazaleh, Gales Ferry, CT (US); Nathaniel L. Herring, Norwich, CT (US); John J. Milner, Milford, CT (US); Randolph Ruetsch, Branchburg, NJ (US); Naved Habib, Hartford, CT (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 10/274,369

(22) Filed: Oct. 21, 2002

(65) Prior Publication Data

US 2004/0077222 A1 Apr. 22, 2004

(51) Int. Cl.[7] ......................... H01R 24/00; H01R 9/22; H01R 13/73
(52) U.S. Cl. ....................... 439/676; 439/941
(58) Field of Search ................. 439/676, 941, 439/404, 405

(56) References Cited

U.S. PATENT DOCUMENTS

| | | | |
|---|---|---|---|
| 3,369,214 A | 2/1968 | Krumreich et al. | |
| 4,875,863 A | 10/1989 | Reed | |
| 5,186,647 A | 2/1993 | Denkmann et al. | |
| 5,357,051 A | 10/1994 | Hwang | |
| 5,362,257 A | 11/1994 | Neal et al. | |
| 5,403,200 A | 4/1995 | Chen | |
| 5,697,817 A | 12/1997 | Bouchan et al. | |
| 5,779,503 A * | 7/1998 | Tremblay et al. | 439/676 |
| 5,860,819 A | 1/1999 | Northey et al. | |
| 5,911,602 A | 6/1999 | Vaden | |
| 5,921,818 A | 7/1999 | Larsen et al. | |
| 5,938,479 A | 8/1999 | Paulson et al. | |
| 5,941,734 A | 8/1999 | Ikeda et al. | |
| 5,967,828 A | 10/1999 | Geurts et al. | |
| 5,975,960 A | 11/1999 | Fogg et al. | |
| 6,012,936 A | 1/2000 | Siemon et al. | |
| 6,017,247 A | 1/2000 | Gwiazdowski | |
| 6,093,059 A | 7/2000 | Bogese | |
| 6,093,060 A | 7/2000 | Wiebking et al. | |
| 6,102,722 A | 8/2000 | Arnett | |
| 6,116,964 A | 9/2000 | Goodrich et al. | |
| 6,120,329 A | 9/2000 | Steinman | |
| 6,120,330 A | 9/2000 | Gwiazdowski | |
| 6,135,821 A | 10/2000 | Liu | |
| 6,139,368 A | 10/2000 | Bogese, II | |
| 6,139,371 A | 10/2000 | Troutman et al. | |
| 6,165,023 A | 12/2000 | Troutman et al. | |
| 6,176,742 B1 | 1/2001 | Arnett et al. | |
| 6,180,529 B1 * | 1/2001 | Gu | 438/706 |
| 6,186,834 B1 | 2/2001 | Arnett et al. | |
| 6,186,836 B1 | 2/2001 | Ezawa et al. | |
| 6,193,526 B1 | 2/2001 | Milner et al. | 439/76.1 |
| 6,196,880 B1 | 3/2001 | Goodrich et al. | |

(List continued on next page.)

FOREIGN PATENT DOCUMENTS

| | | |
|---|---|---|
| EP | 1 246 318 | 10/2002 |
| EP | 1 255 322 | 11/2002 |

*Primary Examiner*—Chandrika Prasad
(74) *Attorney, Agent, or Firm*—Daniel G. Shanley; Mark S. Bicks; Alfred N. Goodman

(57) ABSTRACT

The present invention relates to an electrical connector for telecommunications applications, including a circuit board and first and second electrical contacts, extending from the circuit board along first and second paths, respectively, the second path crossing the first path. A third electrical contact extends from the circuit board along a third path, and a fourth electrical contact extends from the circuit board along a fourth path, the fourth path crossing the third path. At least four electrical terminals extend from the circuit board and at least four electrically conductive traces on the circuit board electrically couple each of the first, second, third and fourth electrical contacts to a respective electrical terminal.

24 Claims, 14 Drawing Sheets

U.S. PATENT DOCUMENTS

| | | |
|---|---|---|
| 6,224,427 B1 | 5/2001 | Goodrich |
| 6,244,906 B1 | 6/2001 | Hashim et al. |
| 6,244,907 B1 | 6/2001 | Arnett |
| 6,270,381 B1 | 8/2001 | Adriaenssens et al. |
| 6,280,256 B1 | 8/2001 | Belopolsky et al. |
| 6,283,795 B1 | 9/2001 | Chen |
| 6,290,546 B1 | 9/2001 | Pharney |
| 6,319,069 B1 | 11/2001 | Gwiazdowski |
| 6,332,810 B1 | 12/2001 | Bareel |
| 6,338,643 B1 | 1/2002 | Miller et al. ............... 439/417 |
| 6,350,158 B1 | 2/2002 | Arnett et al. |
| 6,394,835 B1 | 5/2002 | Milner et al. ............... 439/404 |
| 6,394,854 B1 | 5/2002 | Belopolsky et al. |
| 6,402,560 B1 | 6/2002 | Lin |
| 6,409,547 B1 | 6/2002 | Reede |
| 6,435,918 B1 | 8/2002 | Chen |
| 6,443,776 B2 | 9/2002 | Reichle |
| 6,443,777 B1 | 9/2002 | McCurdy et al. |
| 6,454,590 B1 | 9/2002 | Goodrich et al. |
| 6,464,529 B1 | 10/2002 | Jensen et al. |
| 6,464,541 B1 | 10/2002 | Hashim et al. |
| 2001/0016455 A1 | 8/2001 | Reichle |
| 2001/0021608 A1 | 9/2001 | Borbolla et al. |
| 2002/0055302 A1 | 5/2002 | Goodrich et al. |
| 2002/0055303 A1 | 5/2002 | Belopolsky et al. |
| 2002/0061684 A1 | 5/2002 | Aekins et al. |
| 2002/0132532 A1 | 9/2002 | Henneberger |
| 2002/0142644 A1 | 10/2002 | Aekins |
| 2002/0142667 A1 | 10/2002 | Reed et al. |
| 2002/0160662 A1 | 10/2002 | Arnett et al. |
| 2002/0171505 A1 | 11/2002 | Aekins et al. |

\* cited by examiner

ELECTRICAL CONNECTOR FOR TELECOMMUNICATIONS APPLICATIONS

REFERENCE TO RELATED APPLICATION

This application is related to U.S. patent application Ser. No. 09/638,179, filed Aug. 14, 2000, and entitled "Electrical Connector Contact Configurations", the subject matter of which is hereby incorporated by reference.

FIELD OF THE INVENTION

The present invention relates to a high performance jack for an electrical connector for communication and data transmission applications. The jack has contact configurations that avoid coupling imbalance between the plug contact region and the circuit board. More particularly, the present invention relates to a high performance jack that terminates in eight conductors, with the eight conductors being configured to reduce electrical interference and to interconnect with a plug.

BACKGROUND OF THE INVENTION

Due to significant advancements in telecommunications and data transmission speeds over shielded and/or unshielded twisted pair cables, the connectors (jacks, receptacles, patch panels, cross connects, etc.) have become critical factors in achieving high performance in data transmission systems, particularly at the higher frequencies. Some performance characteristics, particularly coupling imbalance, can degrade beyond acceptable levels at new, higher frequencies in the connectors unless adequate precautions are taken.

Often, wiring is pre-existing. Standards define the interface geometry and pin separation for the connectors, making any changes to the wiring and to the connector interface geometry and pin separation for improving performance characteristics cost prohibitive.

The use of shielded and/or unshielded twisted pair wiring and the establishment of certain standards for connector interface geometry and pin separation were created prior to the need for high-speed data transmissions. Thus, while using the shielded and/or existing unshielded twisted pair wiring and complying with the existing standards, connectors must be developed that fulfill the performance requirements of today's higher speed communications, and maintain compatibility with the existing connectors.

Furthermore, conventional jack contacts make electrical contact with the contacts of a plug, when the plug contacts are inserted into the jack and slide along a portion of the jack contacts. In other words, the point of contact actually changes along a length of the jack contact, depending on the point at which the jack contact comes to rest relative to the jack. For many high performance connectors this change of contact point can degrade the signal or result in a varied range of crosstalk insertion point and can yield unacceptable phase control.

Additionally, conventional contacts can have an electrical length exceeding 100 picoseconds (ps), i.e., the time an electrical signal takes to travel from the modular plug interface to the output portion is 100 ps. Electrical lengths exceeding 100 ps generally limit the effectiveness of the compensation, since the signal will degrade through time.

Conventional connectors of this type are disclosed in U.S. Pat. No. 4,975,078 to Stroede, U.S. Pat. No. 5,186,647 to Denkmann et al, U.S. Pat. No. 5,228,872 to Liu, U.S. Pat. No. 5,376,018 to Davis et al, U.S. Pat. No. 5,580,270 to Pantland et al, U.S. Pat. No. 5,586,914 to Foster et al and U.S. Pat. No. 5,628,647 to Roharbaugh et al.

SUMMARY OF THE INVENTION

Accordingly, an object of the present invention is to provide an electrical jack for a telecommunications connector having a contact configuration that improves performance characteristics, but does not require changing standard connector interface geometry and contact separation.

Another object of the present invention is to provide an electrical jack for telecommunications that has a contact configuration that avoids significant coupling imbalance between the plug contact region and the circuit board.

Still another object of the present invention is to provide an electrical contact with an acceptable and relatively constant electrical length.

Yet another object of the present invention is to provide an electrical connector with a modular interface that has a fixed point of interface on the jack contact.

Another object of the present invention is to provide an electrical plug for a telecommunications connector that is simple and inexpensive to manufacture and use.

The foregoing objects are basically obtained by providing an electrical connector for a telecommunications applications, including a circuit board. A first electrical contact extends from the circuit board along a first path and a second electrical contact extends from the circuit board along a second path, the second path crossing the first path. A third electrical contact extends from the circuit board along a third path and a fourth electrical contact extends from the circuit board along a fourth path, the fourth path crossing the third path. At least four electrical terminals extend from the circuit board, and at least four electrically conductive traces on the circuit board electrically couple each of the first, second, third and fourth electrical contacts to a respective electrical terminal.

The foregoing objects are also obtained by providing an electrical connector for telecommunications applications, including a circuit board and first, second and third pairs of electrical contacts coupled to the circuit board. A first portion of each of the contacts in each the pair of contacts extends substantially perpendicular to the circuit board and a second portion of each of the contacts in each the pair of contacts crosses the second portion of a respective contact in each the pair. At least six terminals extend from the circuit board and electrically conductive circuit paths on the circuit board electrically coupling each of the contact to a respective terminal.

The foregoing objects are further obtained by an electrical connector, including a jack having a circuit board and a first contact with a first input portion, a first output portion and a first transitional portion. The first transitional portion connects the first input portion to the first output portion, and the first input portion has a first curved portion that electrically connects with a corresponding first plug contact. This configuration allows the first transitional portion to have an effective length that is substantially constant after repeated coupling with the corresponding first plug contact.

By forming the electrical jack for a telecommunications connector as described, the connector will have improved performance characteristics, without changing the standard plug connector geometry and contact definitions.

Other objects, advantages and salient features of the invention will become apparent from the following detailed description, which, taken in conjunction with the annexed drawings, discloses preferred embodiments of the invention.

As used herein, terms, such as "left", "right", "upwardly", "downwardly", "forwardly" and "backwardly", are relative directions, and do not limit the connecting unit to any specific orientation.

BRIEF DESCRIPTION OF THE DRAWINGS

Referring to the drawings which form a part of this disclosure.

DETAILED DESCRIPTION OF THE INVENTION

Figure 1:
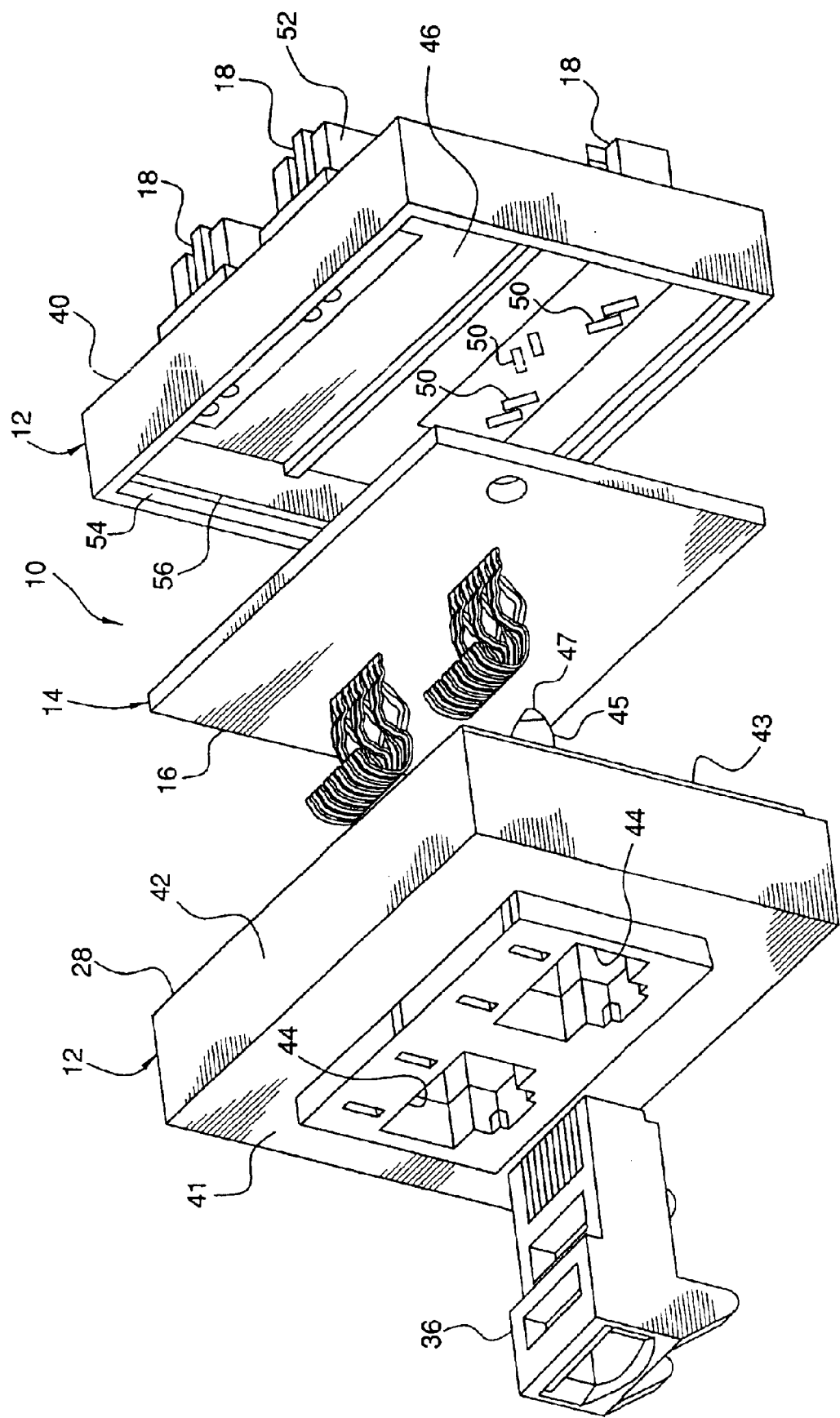
FIG. 1 is an exploded perspective top view of a high performance jack according to a first embodiment of the present invention, along with a plug.
Figure 2:
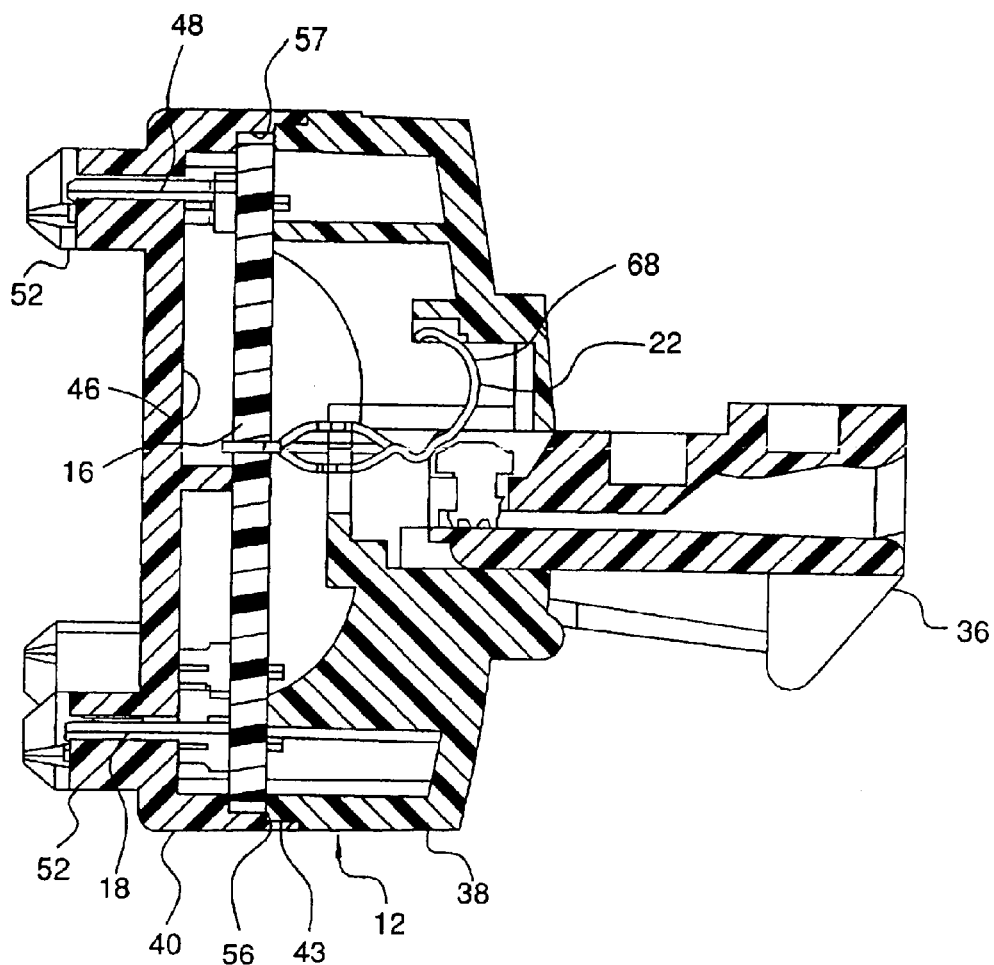
FIG. 2 is a side elevational view in section of the jack and plug of FIG. 1 assembled and in the process of being coupled together, but not fully mated.
Figure 3:
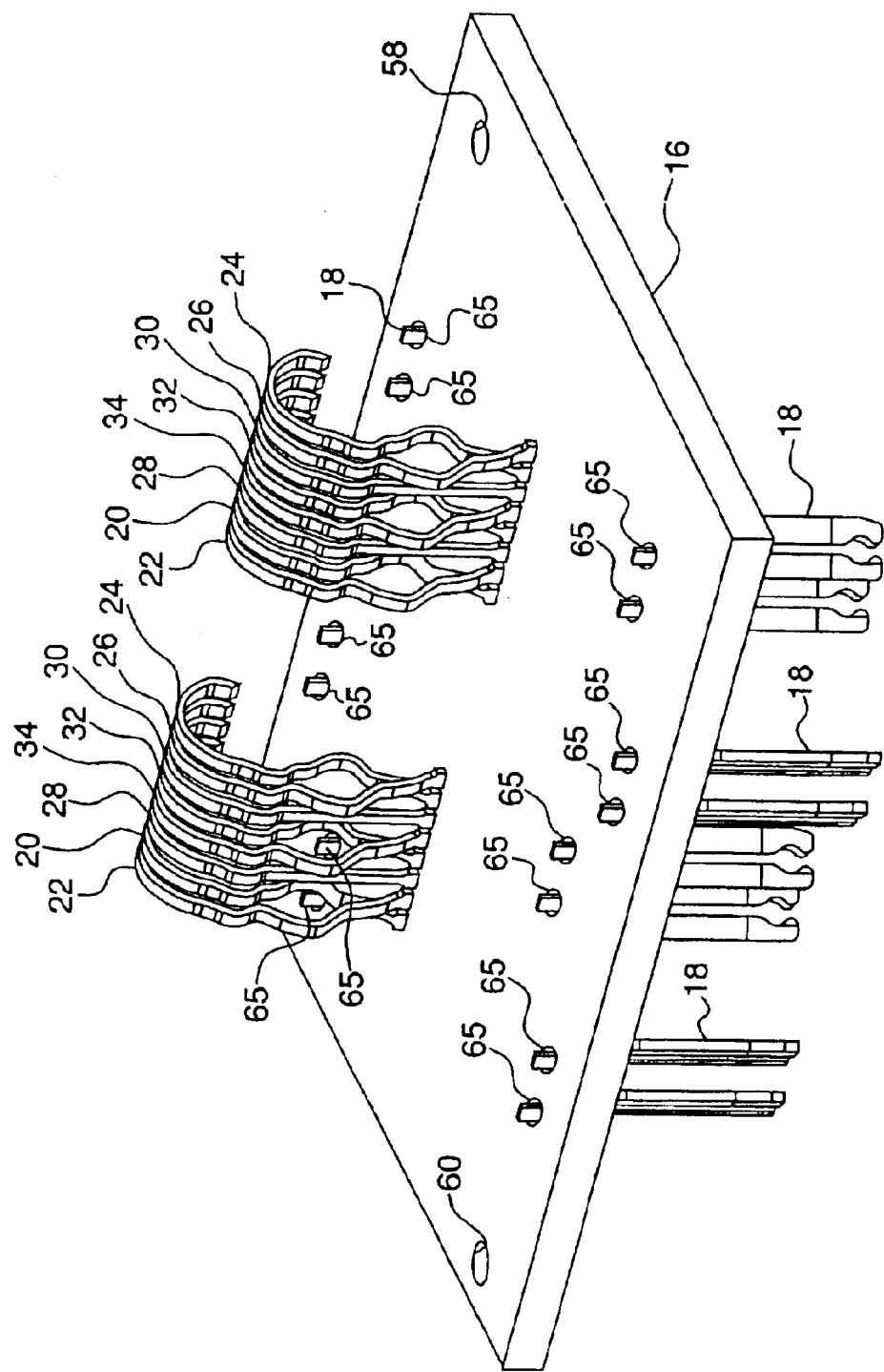
FIG. 3 is an enlarged perspective bottom view of the contact configuration and circuit board of FIG. 1.

A high performance multiport jack or connector 10 for telecommunication applications according to the present invention is schematically or diagrammatically illustrated in FIGS. 1 and 2. The connector comprises a connector body or housing 12 and a wire connecting unit 14 coupled to the connector body. The wiring unit comprises a printed circuit board 16 on which terminals 18 are mounted. The terminals 18 are standard 110 insulation displacement contacts (IDC). Through the circuit board, these terminals are electrically and mechanically coupled to resilient contacts 20, 22, 24, 26, 28, 30, 32 and 34 (FIG. 3). The resilient contacts extend into the connector body in a configuration for electrical connection to a conventional or standard plug 36, particularly an RJ plug.

Figure 1A:
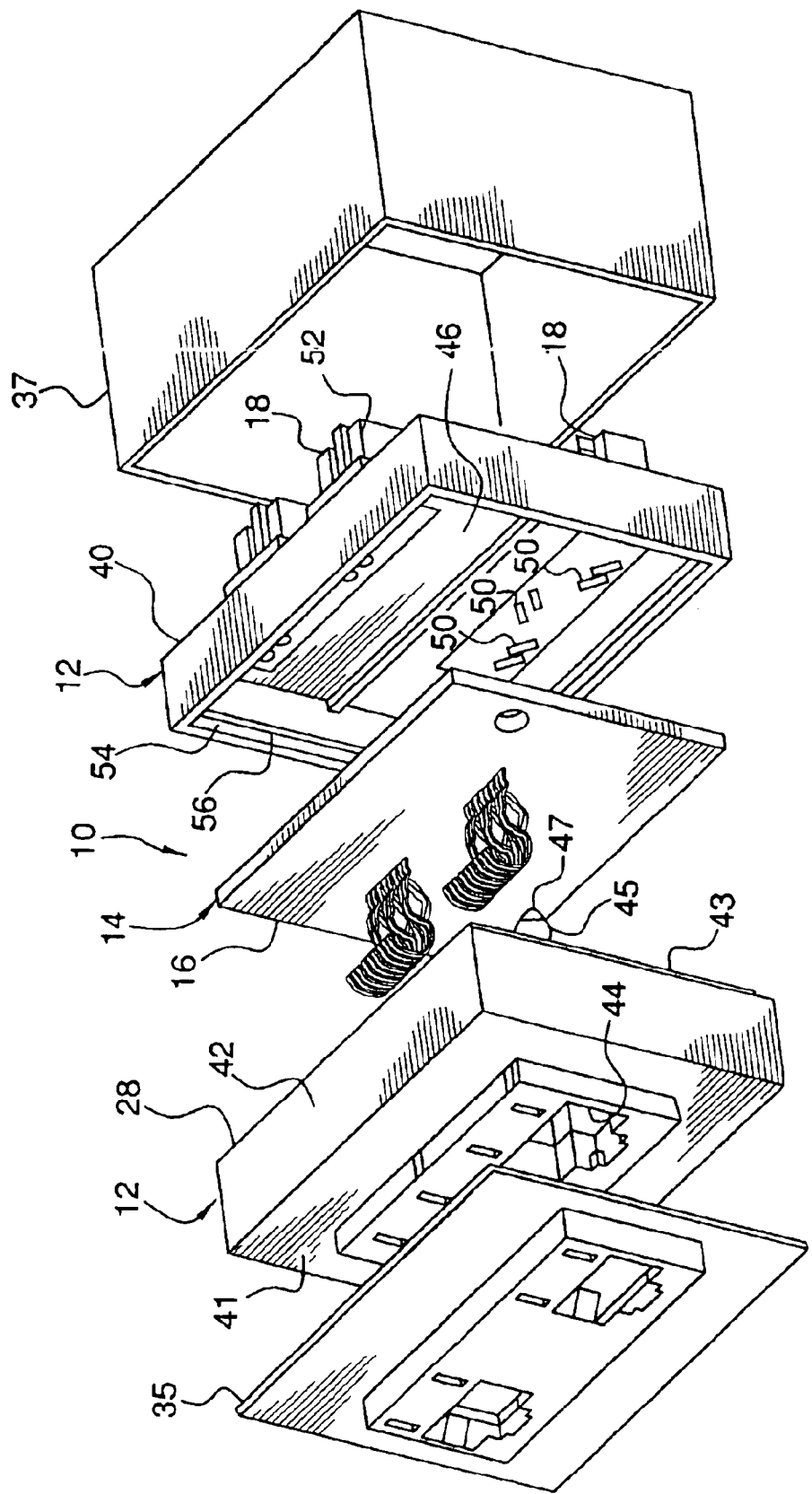
FIG. 1a is an exploded perspective view of the high performance jack of FIG. 1 with a shield therearound.

Preferably the jack 10 is unshielded; however, as shown in FIG. 1a, the housing can be encased or shielded using front shielding portion 35 and back shielding portion 37. The shielding portions protect the jack as is known in the art, while still allowing uninhibited access to openings 44 for a plug. Additionally, the jack 10 can be shielded using any conventional means and not necessarily as described and shown herein.

In the illustrated embodiment, connector body 12 is in the form of a jack. However, the connector body can be of any desired form, such as a plug, cross connect or any other connector in the telecommunications or data transmission field.

Connector body 12 is generally hollow and has a front or first substantially rectangular housing portion 38 and a rear or second substantially rectangular housing portion 40. The front housing portion 38 is preferably rectangular and has a front face or surface 40 and a perimeter wall 42 that is coupled to the front face at about a 90° angle and extends substantially around the entire perimeter of the front face 41. Extending from perimeter wall 42 is a protrusion or lip 43 that is congruent with the wall 42. Additionally, at least one and preferably two extensions 45 extend outwardly and backwardly from front housing portion 38. Each extension 45 is preferably substantially cylindrical with a conical end portion 47. Additionally, front face 41 has two forwardly opening cavities 44, each for receiving a conventional RJ plug 36, as is known in the art.

The rear housing portion 40 has substantially the same dimensions as the first housing portion 38 and couples thereto. The rear housing portion has a rear wall 46 and a perimeter wall 48, perimeter wall 48 is coupled to the rear wall at about a 90° angle and extends substantially around the entire perimeter of the rear wall. Rear wall 46 has eight longitudinal apertures 50 (or 4 pairs) therein that allow electrical terminals 18 to extend from the exterior of the housing and through the wall 48 and make electrical contact with the circuit board 16. The apertures are preferably set at a 45° angle to the perimeter wall 48 and are grouped in pairs. As shown in FIG. 1, the pairs alternate direction and alternate the position from which they extend. In other words, alternating pairs of apertures are turned 90° from an adjacent pair of apertures and are linearly offset so that alternating pairs are not in the same position relative to the center of the rear wall 48. Protruding or extending from the inner surface 54 of the perimeter wall 48 is a lip or ledge 56. Lip 56 extends substantially around the inner surface 54. Additionally, rear housing portion 38 has a groove 57 extending around the interior wall thereof, which accepts circuit board 16, as shown in FIG. 2.

As shown in FIG. 1, the terminals 18 are protected by housing extensions 52 that extend outwardly away from the rear wall 48 and generally cover the terminals 18. The extensions 52 have openings therein allowing the terminals to be partially exposed for electrical contact with electrical wiring, as is known in the art.

Circuit board 16 is preferably substantially rectangular and sized and configured to fit within rear housing portion 40. As seen in FIG. 3, circuit board 16 has substantially circular openings 58 and 60 extending therethrough, which are sized to allow protrusions 45 (FIG. 1) to extend therethrough. Openings 58 and 60 are preferably at opposite corners and ends of the circuit board 16, but can be orientated or positioned in any manner desired. Furthermore, board 16 can have more than two or less than two openings, if desired, including no openings.

Figure 7:
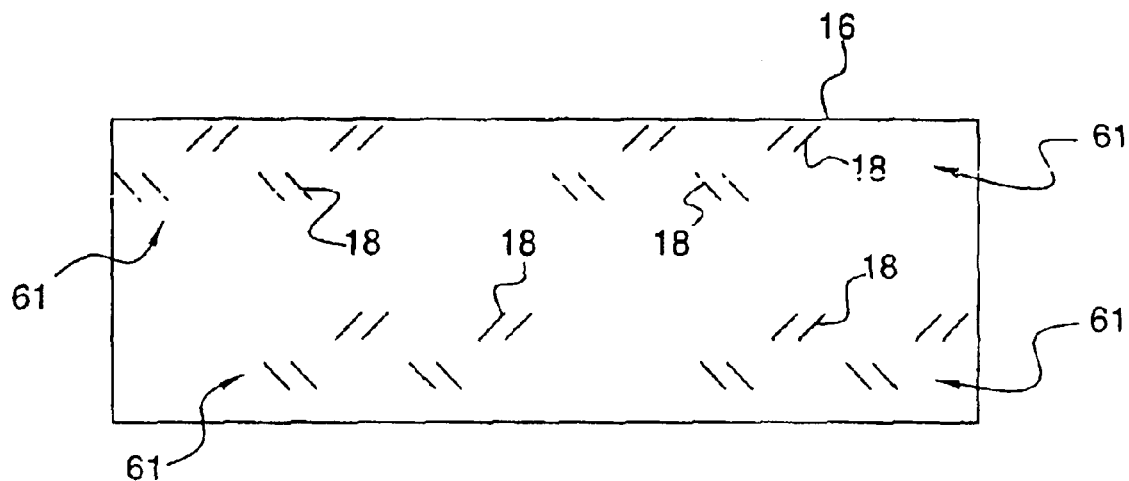
FIG. 7 is a bottom plan view of the circuit board for an embodiment of the present invention showing a first configuration of the insulation displacement contacts.
Figure 9:
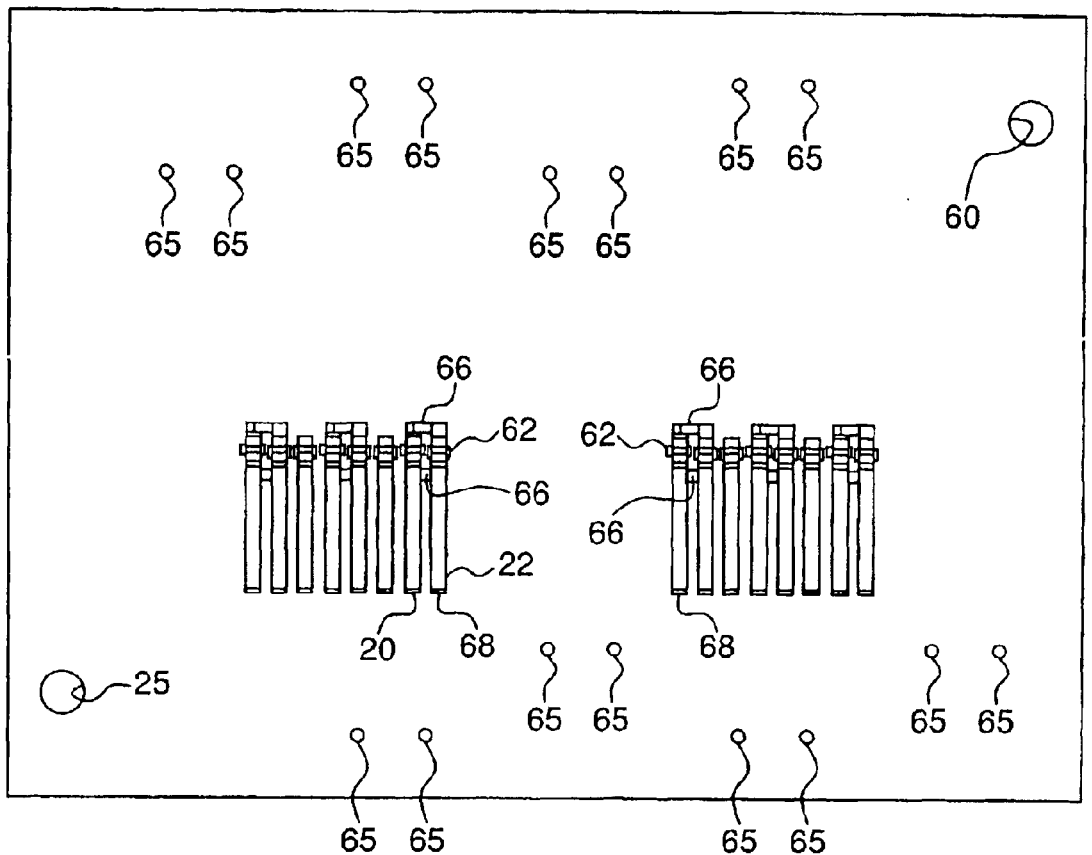
FIG. 9 is top view of the contact configuration and circuit board shown in FIG. 3.
Figure 12:
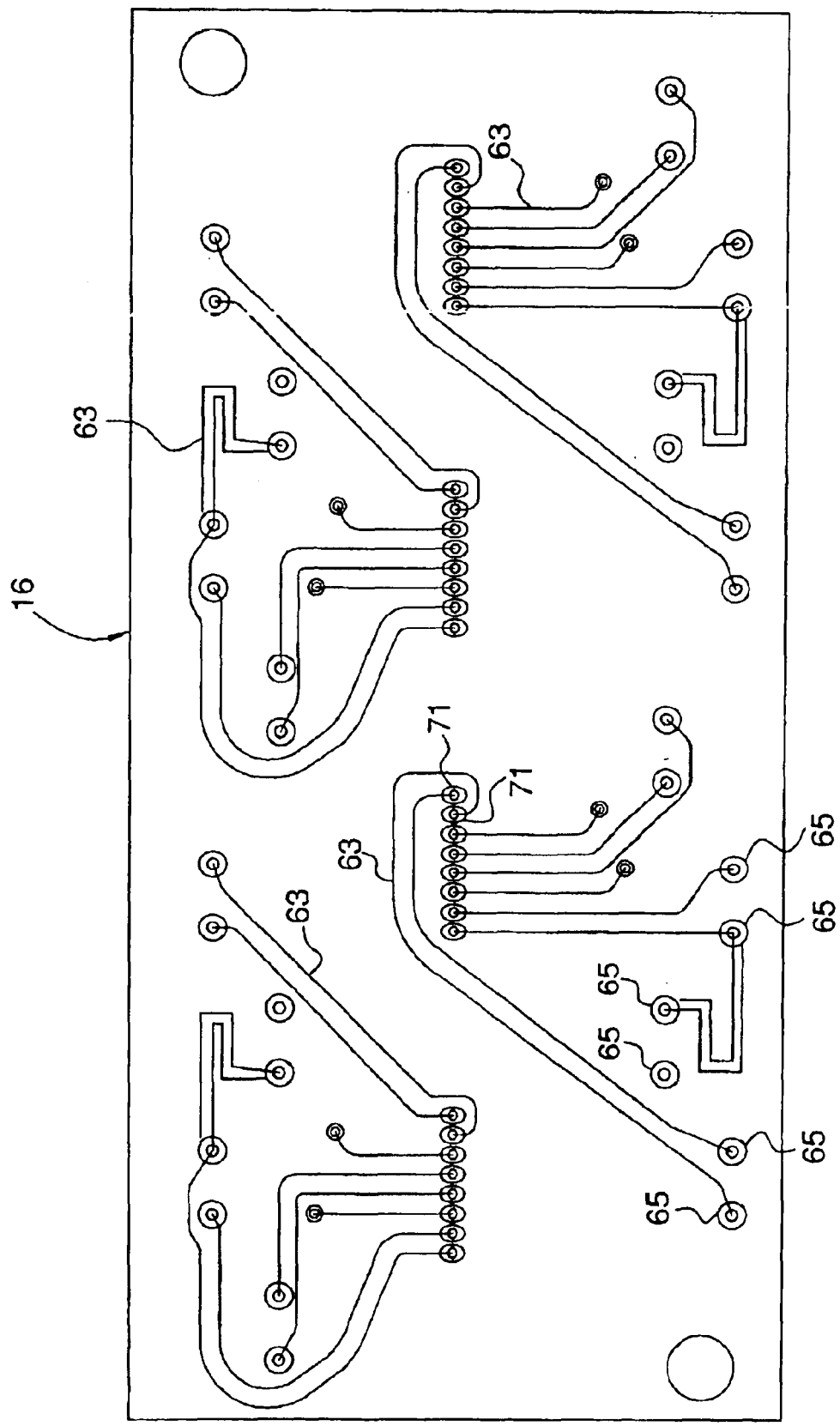
FIG. 12 is a top plan view of a circuit board suitable for the present invention showing the electrical paths on the circuit board.
Figure 13:
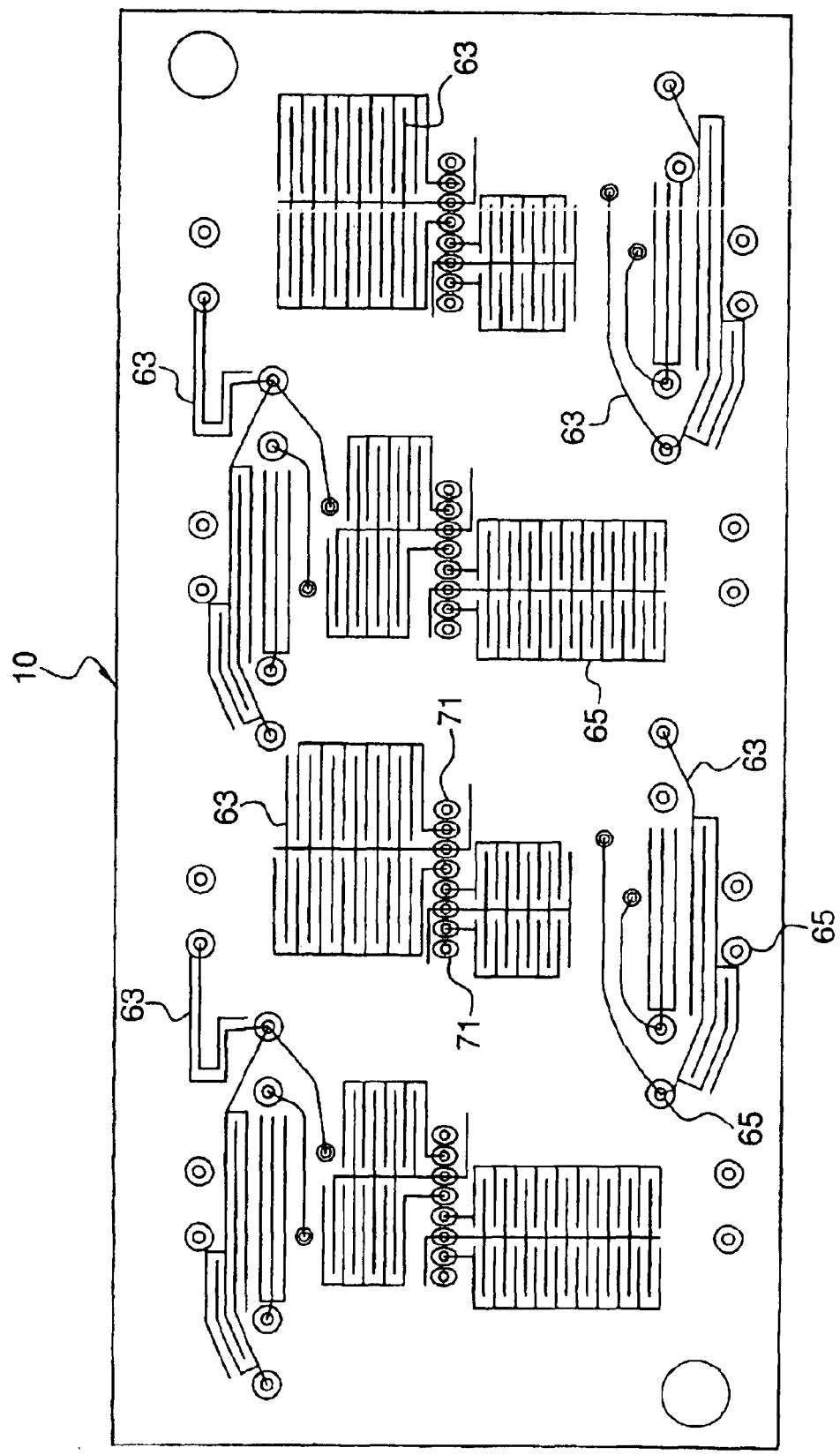
FIG. 13 is a bottom plan view of the circuit board of FIG. 12 showing the electrical paths on the circuit board.
Figure 14:
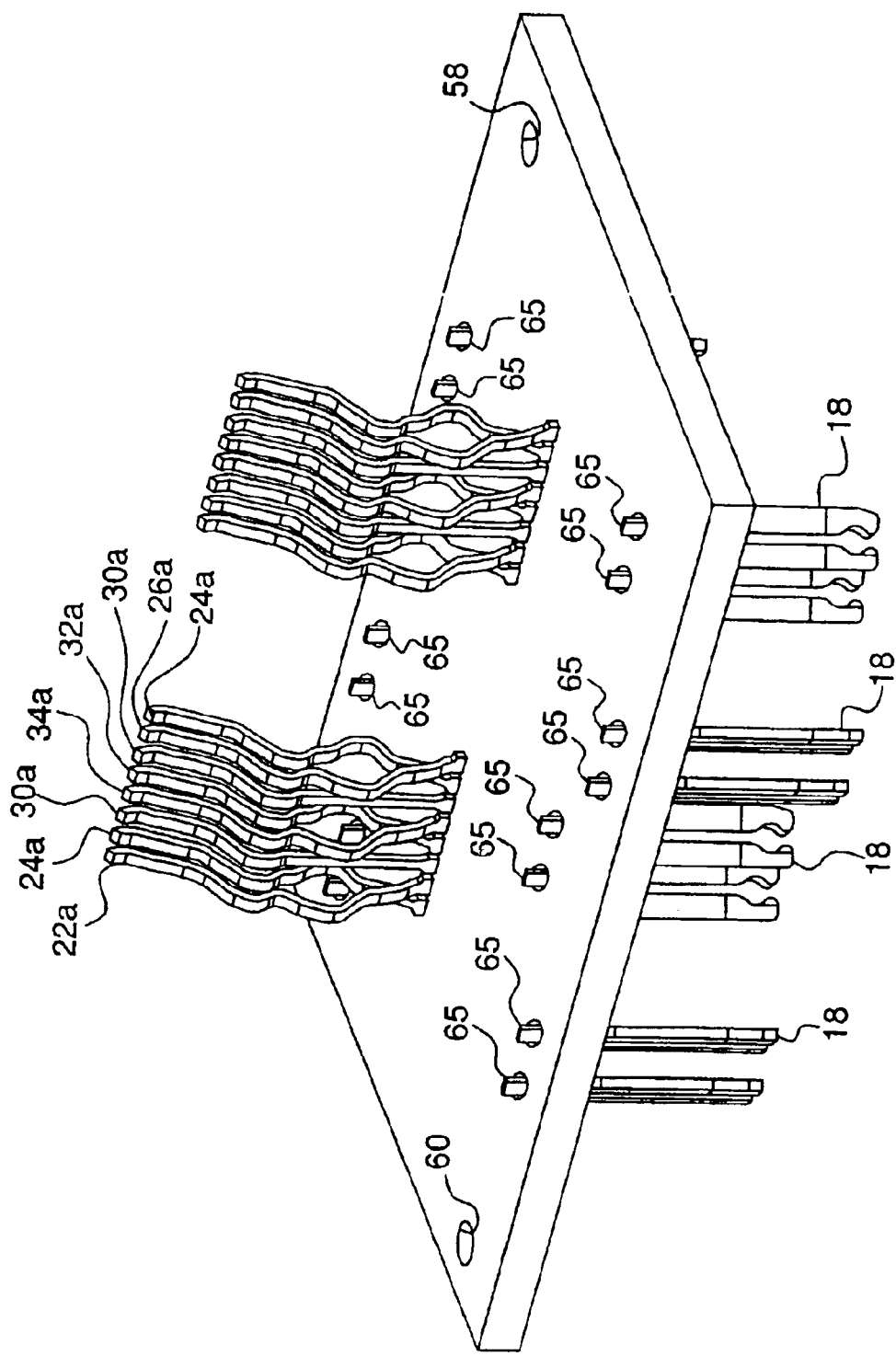
FIG. 14 is an enlarged bottom perspective view of the circuit board and a contact configuration according to a second embodiment of the present invention.

As seen in FIG. 7, circuit board 16 has ports 61 set at angles substantially similar to apertures 50 (FIG. 1). Ports 61 each carry eight terminals 18 for electrically connecting electrical wiring to the circuit traces or paths 63 (FIGS. 12 and 13) on the circuit board 16, which traces or paths are electrically connected to the respective electrical contacts 20–34. Circuit paths 63 allow for electrical enhancement and improvement of the performance of the electrical connector, including reduction of cross talk by the formation, orientation and spacing of the paths. Each terminal is coupled to the circuit board in the conventional manner using openings 65 (FIGS. 3 and 9). Each group of ports 61 includes four pairs or eight contacts. The four pairs of contacts are for each electrical plug. Therefore, each circuit board can be used for two plugs. However, the circuit boards can be used for as many or as few plugs as desired. For example, the circuit boards can be used for as few as one plug or as many as desired. The individual terminals 18 are set a 45° angle relative to the edge of the circuit board and at a 90° angle to the adjacent terminal pairs in an alternating fashion. Furthermore, alternating terminal pairs are offset from an adjacent terminal along a longitudinal line. For example, one terminal pair is closer to one edge of the circuit board than an adjacent terminal pair. Each terminal in a pair is substantially parallel and tightly spaced to the other terminal in the pair. The spacing maintains impedance of each wire pair, resulting in optimal return loss performance for the overall jack. Since each adjacent terminal pair is offset, adjacent terminals are optimized for minimum crosstalk therebetween. Furthermore, since each group of four terminals or port is separated from each adjacent port, the crosstalk between ports is reduced.

Figure 8:
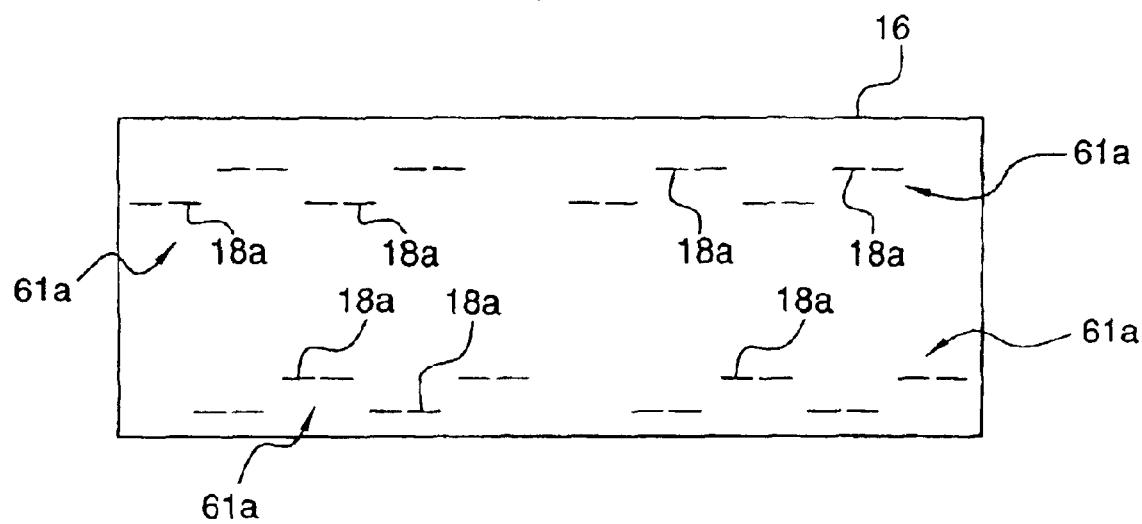
FIG. 8 is a bottom plan view of a circuit board suitable for the present invention, showing the insulation displacement contacts in second configuration.

FIG. 8 shows a second configuration of the terminals 18a in which the terminals are all parallel or coplanar. Each port group 61a is configured similar to that described above for FIG. 7. For example, each port group 61a is positioned to reduce crosstalk between ports and each pair of contacts is offset from an adjacent pair of contacts. However, each contact 18a in a pair of contacts is set linearly or is coplanar with the respective contact in the pair, instead of parallel, thereby maintaining return loss or impedance. The configuration of FIG. 8, results in the same benefits as the configuration shown in 7, but can also maintain return loss performance.

Figures 4, 5:
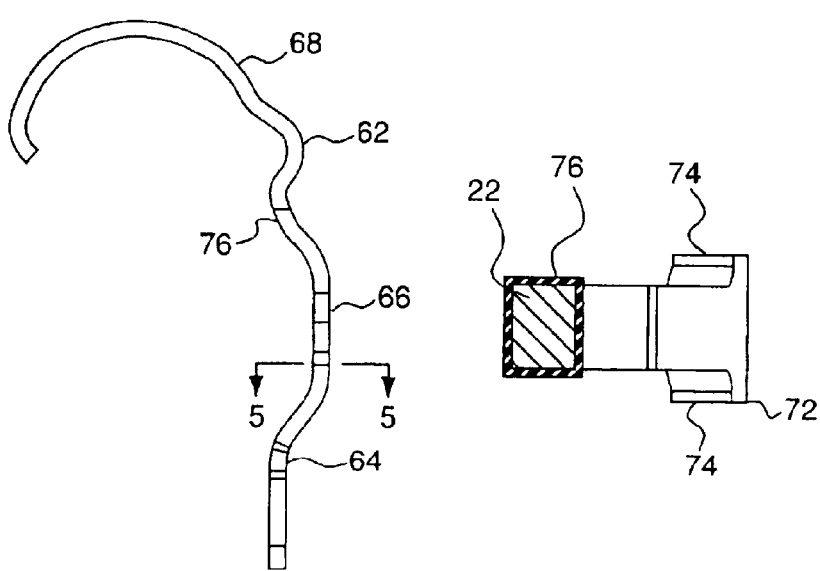
FIG. 4 is a side elevational view of one of the cross over contacts of FIG. 3.
FIG. 5 is a top plan view in section of the cross over contact taken along lines 5—5 of FIG. 4.
Figure 6:
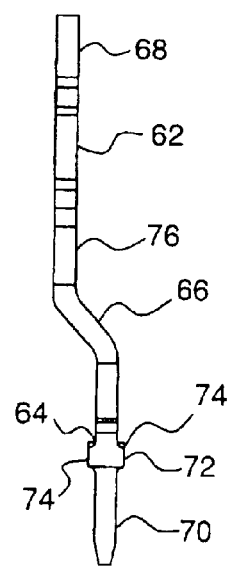
FIG. 6 is a front elevational view of the contact of FIG. 5.
Figure 10:
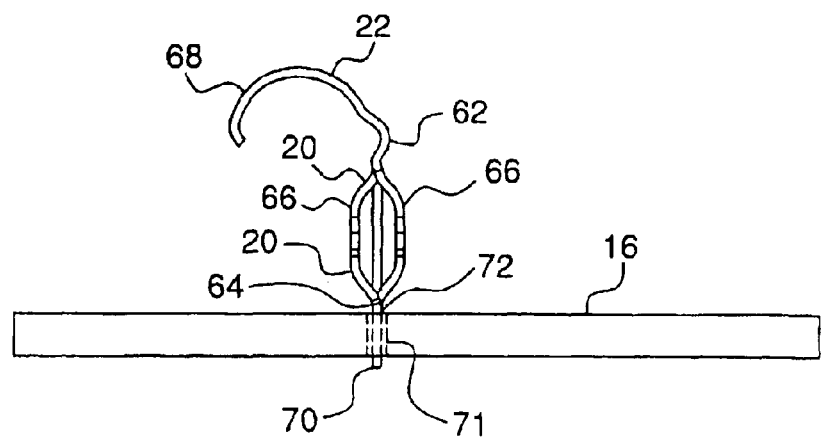
FIG. 10 is a side elevational view of the contact configuration and circuit board shown in FIG. 9.

Contacts 20, 22, 24, 26, 28, 30, 32 and 34 extend outwardly and substantially perpendicularly from circuit board 16, as seen in FIGS. 2 and 10. Contact 22 is shown in FIGS. 4–6. Contact 22 is substantially similar to contacts 26 and 34 and therefore only contact 22 will be described herein. Contact 22 is substantially rectangular and has an input or contact portion 62 and an output or connecting portion 64, a transitional portion 66 and a spring portion 68.

Beginning with the description at the point in which contact 22 is coupled to the circuit board 16 or at the output portion, the contact has a portion 70 configured to be inserted into a aperture 71 (FIG. 10) in the circuit board and to frictional engage the inner wall of the aperture. Adjacent portion 70, pusher foot 72 has two protrusions 74 that extend laterally outwardly from the contact and are used to insert the contact into the circuit board. However, it is not necessary for the pusher foot 72 to have two protrusions 74. The pusher foot can have only one protrusion as described in U.S. patent application Ser. No. 09/638,179, referenced above.

Transitional portion 66 is immediately adjacent output portion 64 and/or the circuit board 16 and extends upwardly away from output portion 64, which is at an interface with the circuit board 16. As transitional portion 64 extends upwardly, it alters its path both forwardly and laterally to the left and then backwardly, as seen specifically in FIGS. 4–6, 9 and 10. Transitional portion 66 can be coated with a nonconductive or insulation portion 76 that substantially surrounds the entire contact 22, as shown in FIG. 5. However, if a coating is applied, the coating can cover only a portion of the transitional portion or one, two or three sides of the contact. Preferably, the coating at least covers the back surface of the contact or the portion of the contact that faces an adjacent contact. Furthermore, the coating portion can be electrical insulation, similar to coating of electrical wires, and can be applied using a brushing technique or applied in any other way desired. When using the brushing or other techniques, the coating can be applied before, after, during or any combination of these times to the contacts. The coating can coat each individual contact or can be a solid unit that covers and joins all the contacts together.

Figure 2A:
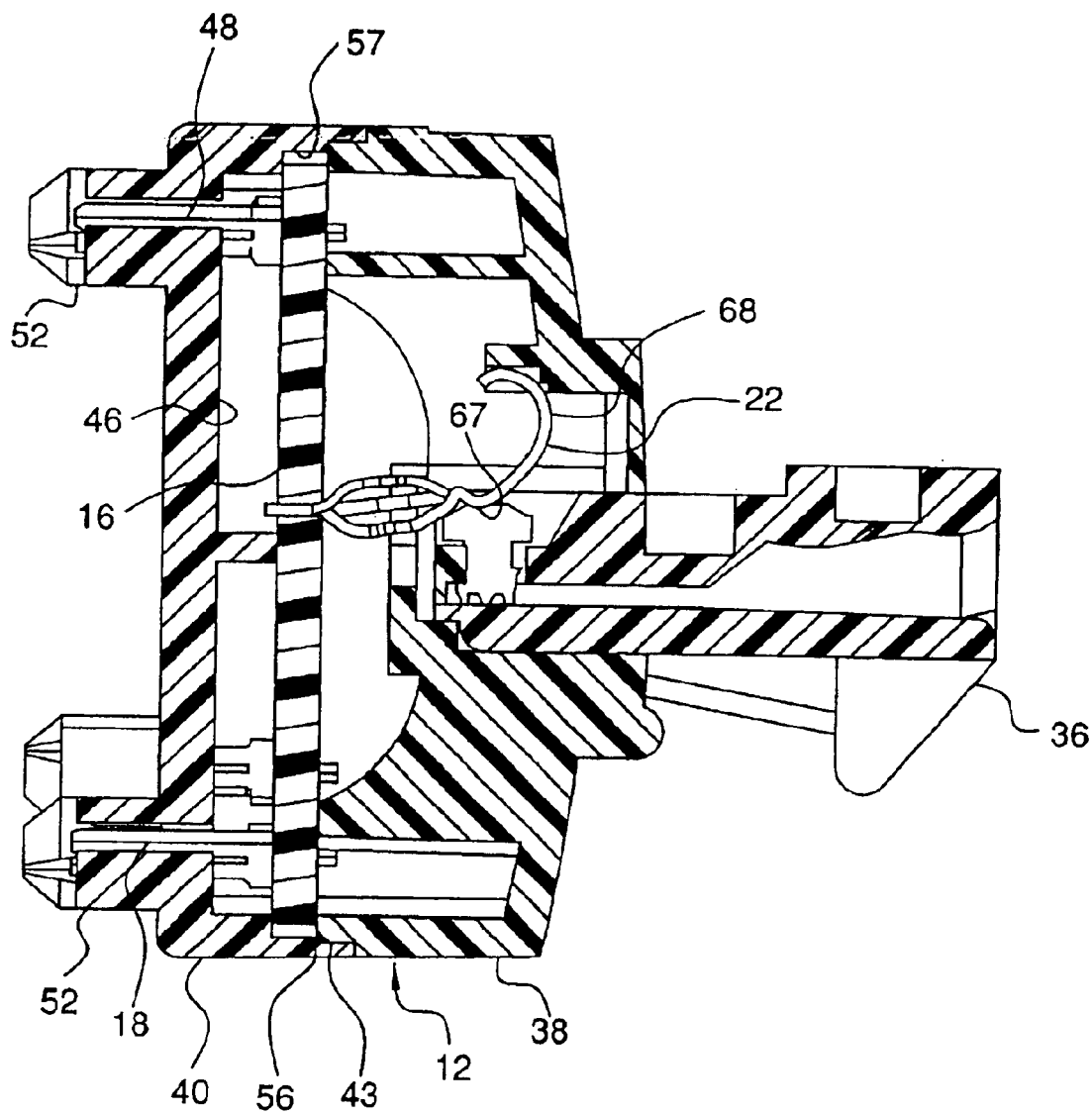
FIG. 2a is a side elevational view in section of the jack and plug of FIG. 2 with the contacts deflected and the plug and jack fully mated.

As seen in FIGS. 4–6, input portion 62 is substantially rectangular (and more preferably, substantially square) and has a semicircular or curved portion that is immediately adjacent the transitional portion 66. Input portion 62 curves forwardly and makes electrical contact with the electrical contacts of a plug. By forming the input portion in this curved manner, the contact 22 has a fixed point of interface with the plug contact. More specifically, when the plug contact is inserted into the jack, the plug contact contacts the upper most part of the input portion and slides along the curved portion thereof (FIG. 2). As the plug contact is inserted into a fully inserted position (FIG. 2a), the plug slides along and comes to rest at the most forward point of the radius of curvature on the input portion 62. The most forward point of the radius of curvature connects with a corresponding plug contact at a preset contact point 67 (FIG. 2b). This contact of the input portion 62 and the plug contact results in the neutral axis length of contact 22 or the effective length being essentially constant for each contact in repeated coupling with a respective plug contact. In other words, the effective conductive length between the preset contact point 67 and the output portion 64 is substantially constant for repeated couplings with a corresponding plug contact. This contact method maintains the point of interface on the jack contact, which fixes the crosstalk insertion point and yields improved phase control. Thus, the signal always arrives to the output portion 64 with the same phase (time delay) allowing the compensation to be done more accurately and more effectively.

Furthermore, a substantially square or rectangular cross sectional configuration allows the contact to engage a square, similarly sized contact in a plug in a plane or a line. This type of contact is generally more suitable than the prior art cylindrical contacts, which would only contact at a point, since the hertz stress value can be controlled tightly.

By forming the input portion 62 immediately adjacent the transitional portion 66, and having the transitional portion couple the input portion to the output portion, as described, the electrical length of the contact is preferably about 70 picoseconds (ps) or less, but can be up to about 100 ps. This short contact minimizes the time delay or phase offset between the modular plug interface and the circuit board, which minimizes phase translation.

Spring portion 68 extends upwardly adjacent the input portion and curves backwardly and then downwardly. As seen in FIG. 2, spring portion 68 contacts an inner wall of the housing 12, thereby imparting a spring force to the contact 22 and ensuring a good consistent electrical connection between the contact of the plug and the contact of the jack.

Contacts 22, 26 and 34 are mirror images of contacts 20, 24 and 32, and are substantially the same length. In other words, at the points where contacts 22, 26 and 34 extend forwardly, contacts 20, 24 and 32 extend backwardly and at the point where contacts 22, 26 and 34 extend laterally to the left, contacts 20, 24 and 32 extend laterally to the right, etc. Therefore, when the contacts are mounted to the circuit board each pair of contacts 20 and 22, contacts 24 and 26 and contacts 32 and 34 each cross paths, respectively, without making electrical contact therebetween. For example, as contacts 20 extends upwardly, the contact curves to the right and backwardly; while, contact 22 curves forwardly and to the left. Each contact crosses paths with each contact in a respective pair with the transitional portion 66 of each contact or the insulation portion 76 of each contact passing adjacent to each other.

This configuration permits a phase/location shift, allowing control of the time delay and proper orientation for coupling to the circuits in the circuit board. The circuit path in the circuit board is positioned for optimal capacitive and inductive coupling at the contact/circuit board interface. Therefore, by reversing the contact positions as described, the contacts swap paths, thereby achieving the proper positioning for electrical coupling with the circuits in the circuit board.

The transitional portions of each of these contacts are preferably as short as possible and therefore, do not necessarily have any straight portions. In other words, preferably, immediately adjacent output portion 64, transitional portion 66 begins to curve forwardly and laterally to the left (in the case of contact 22) and then backwardly. This short type of configuration of the transitional portion allows the electrical signal to be transmitted from the input portion to the output portion at a faster rate. Thus, there is less degradation in the signal than in convention contact configurations.

Contacts 28 and 30 extend upwardly from the circuit board substantially parallel to each other and have a portion that is substantially straight. Each contact has a contact portion 62 and a spring portion 68 that are substantially similar in configuration and purpose of the contact portion 62 and spring portion 68 of contact 22.

Figure 11:
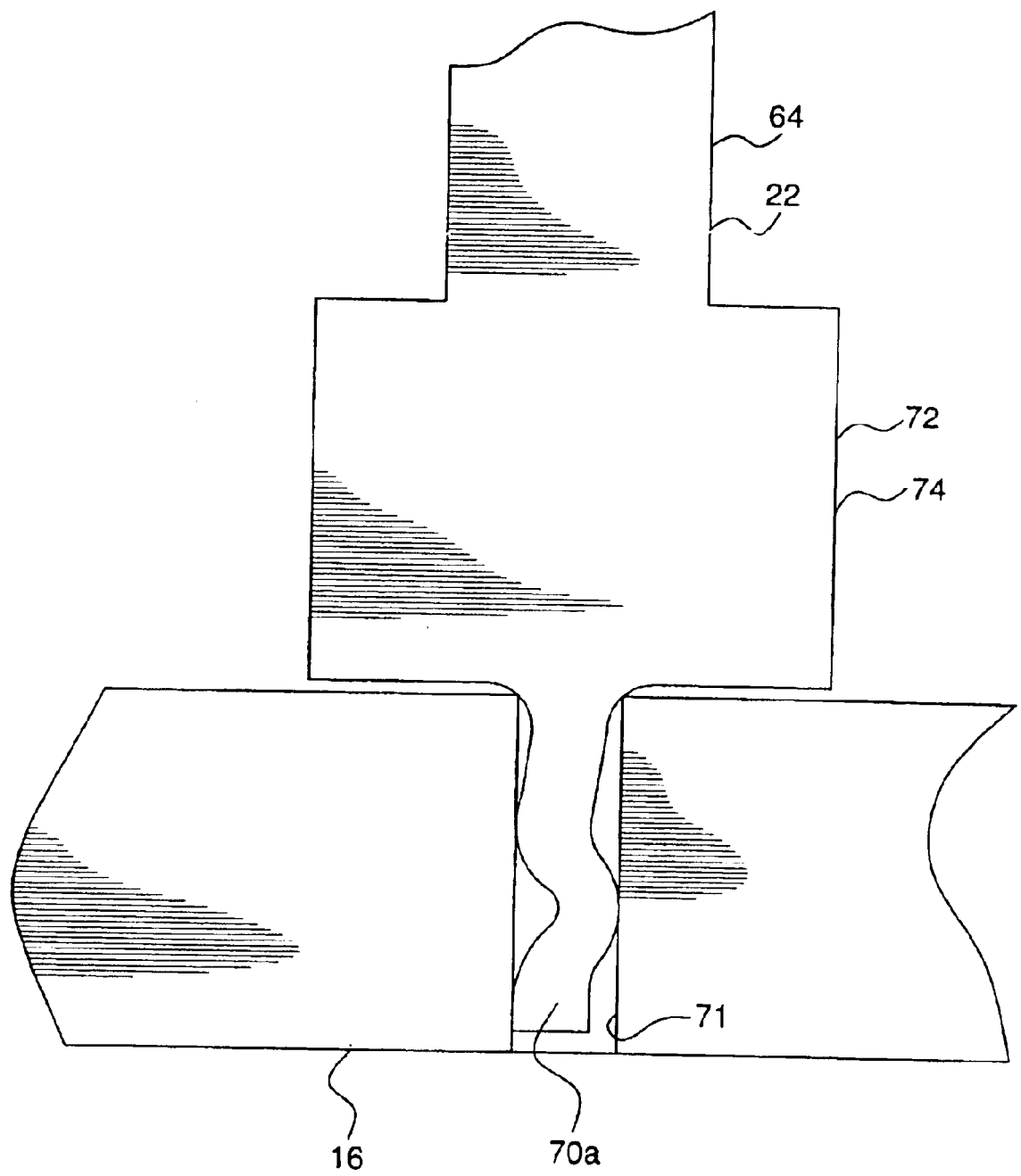
FIG. 11 is a front elevational view of a contact according to a second embodiment of the present invention wherein a compliant pin couples the contact to the circuit board.

As shown in FIG. 11, the portion to be inserted into the circuit board or the compliant pin portion 70a, can be curved, so that when the compliant pin is inserted into aperture 71 in circuit board 16, several different portions of the compliant pin frictionally contact the inner wall of the aperture. For example, in FIG. 11, the compliant pin portion extends downwardly and from an angle other than 90° from the pusher foot 72, and curves back on itself at least twice forming a sine curve type of configuration. Specifically, as shown, three separate protrusions or crests 73, 75 and 77 of the sine curve are formed. Preferably, the lateral distance between the peaks of the curve is greater than the diameter of the aperture 71. This type of configuration allows the protrusions 73, 75 and 77 to frictionally engage the inner wall and affix the contact 22 to the circuit board 16. Furthermore, this pin configuration has a lower insertion force and allows the tolerances of the pins and apertures in the circuit board to be lower, since the pin can conform to a larger range of aperture sizes.

Contact Configuration of FIGS. 14–18

FIGS. 14–18 illustrate a second embodiment for the contacts of the present invention. Each contact has a similar configuration as the contacts described above, except that the end or spring portion 68a is shorter than the spring portion 68 described above.

In this second contact embodiment, the spring portion 68a need not curve backwardly and downwardly as shown in FIG. 4 of the above-described contact 22. Each spring portion 68a terminates by curving slightly forwardly and upwardly, in relation to the circuit board and the other portions of the contacts.

Figure 15:
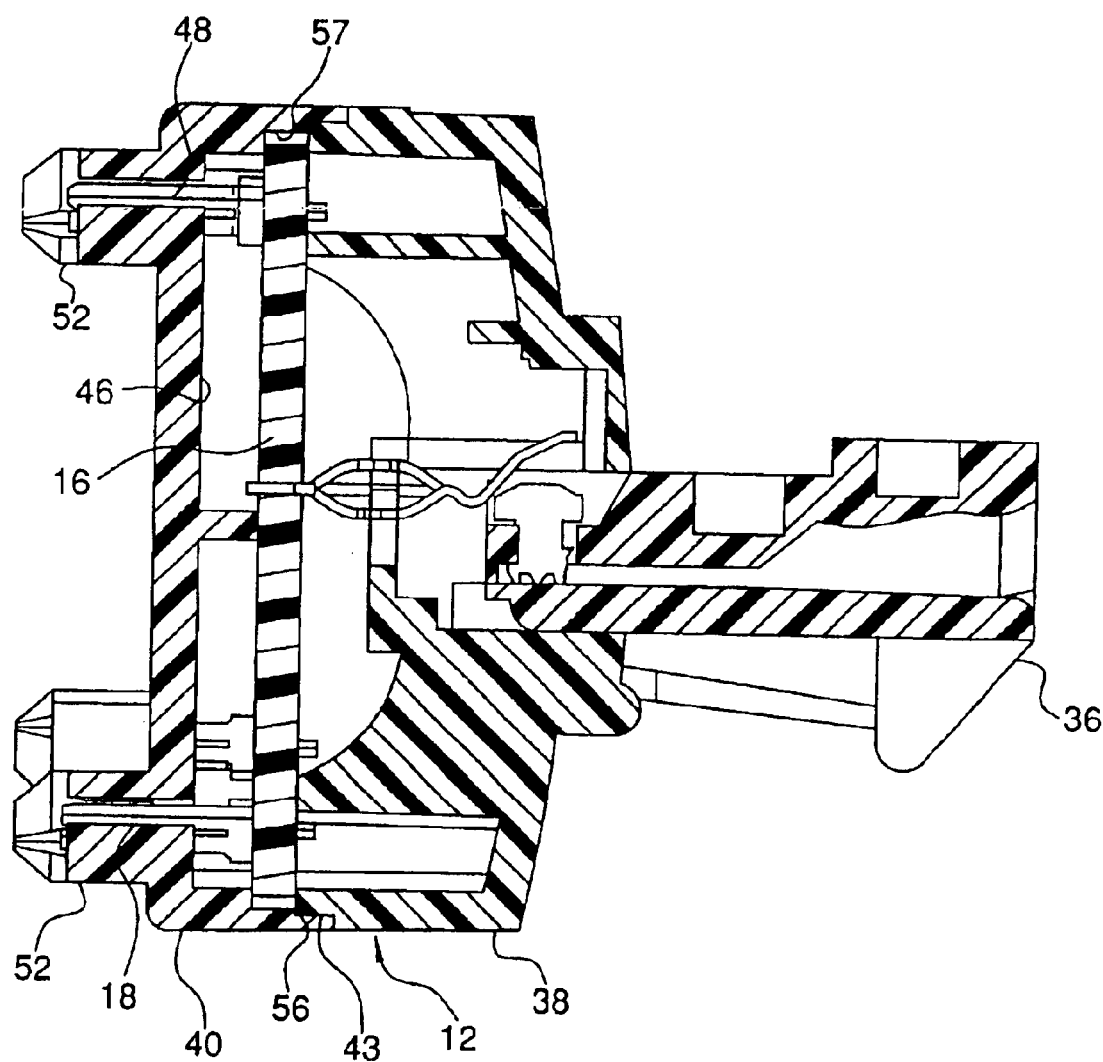
FIG. 15 is a side elevational view in section of a jack and plug having the contact configuration of FIG. 14 assembled and in the process of being coupled together, but not fully mated.
Figure 15A:
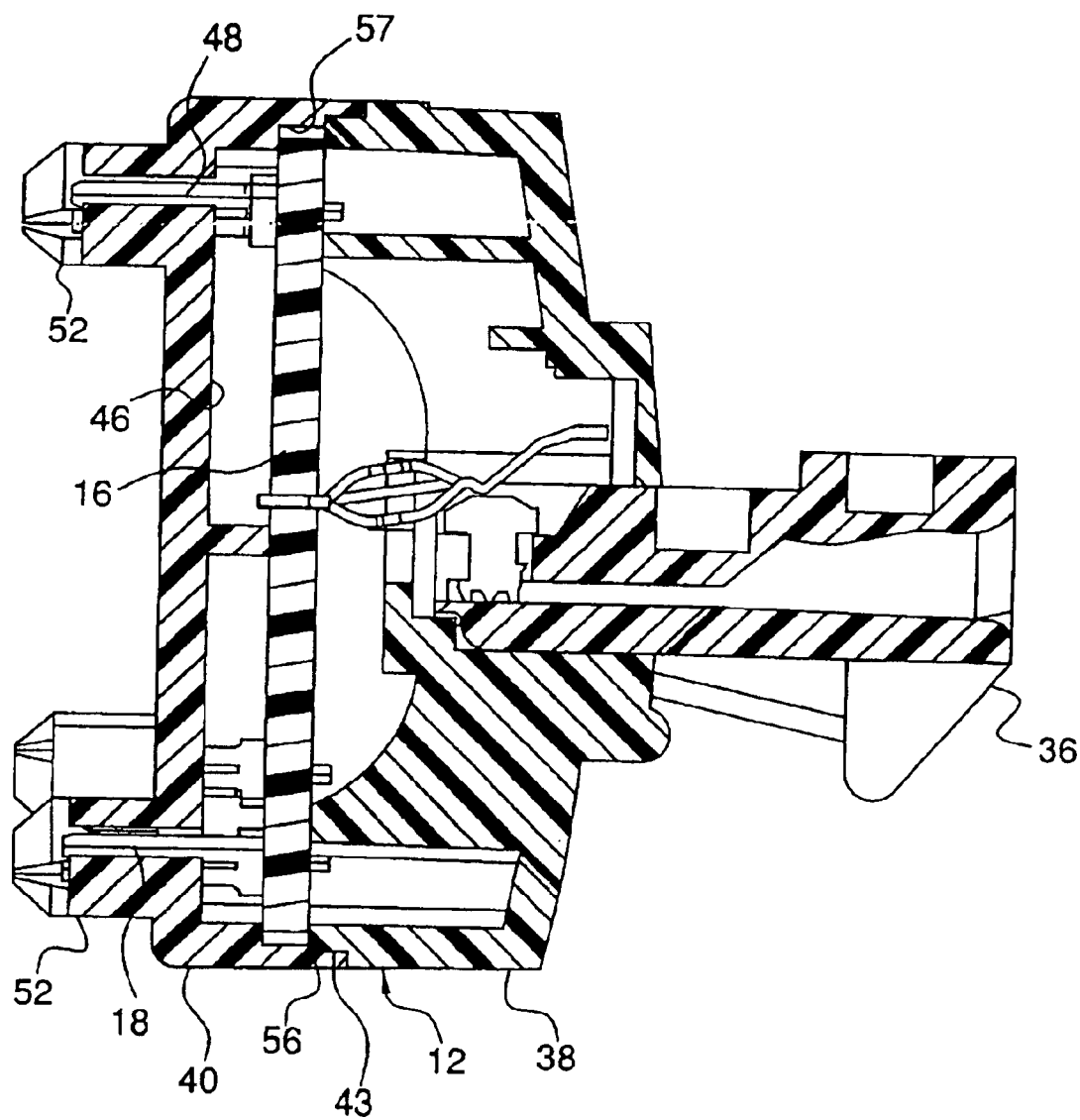
FIG. 15a is a side elevational view in section of the jack and plug of FIG. 15 with the contacts deflected and the plug and jack fully mated.
Figure 16:
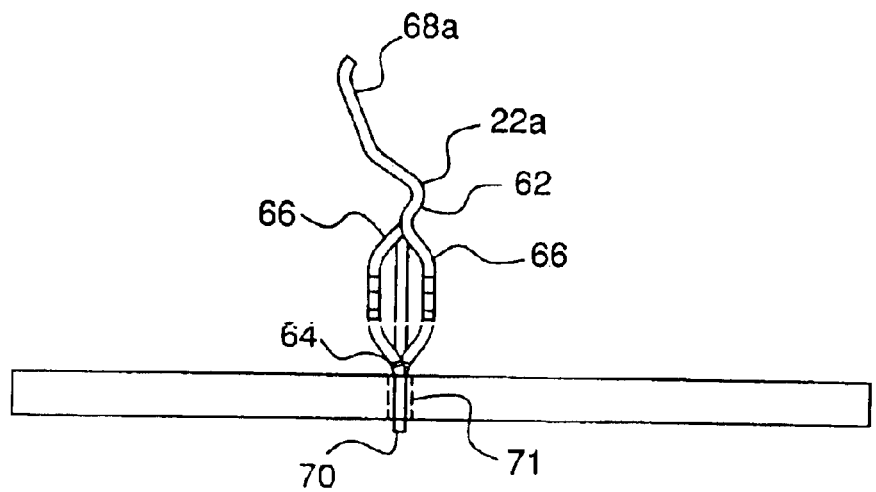
FIG. 16 is a side elevational view of the contact configuration and circuit board shown in FIG. 14.
Figure 17:
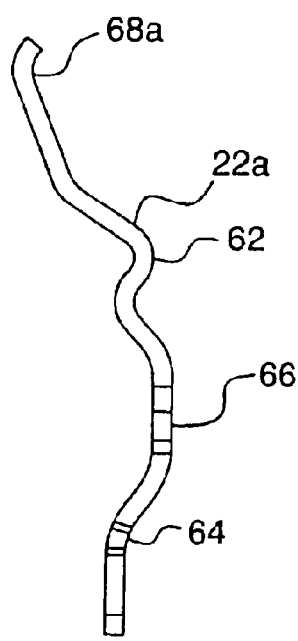
FIG. 17 is a side elevational view of one of the contacts of FIG. 13.
Figure 18:
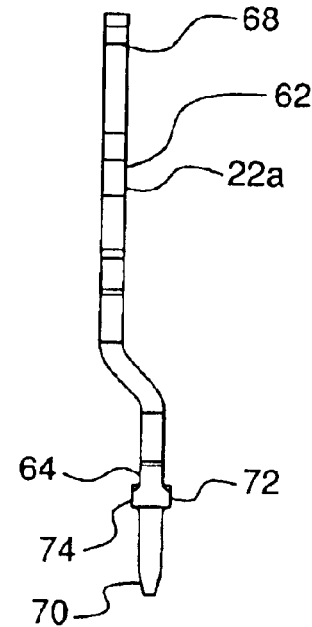
FIG. 18 is a front elevational view of the contact of FIG. 17.

Contacts 22a–38a each have a shorter spring portion 68a than spring portion 68 for contacts 22–38. In fact, the portion 68a preferably does not contact the housing as with the previous contact configuration, and therefore does not necessarily act as a "spring" in the same manner as described above, as shown in FIGS. 15 and 15a. Contacts 22a–38a rely on the connection to the circuit board 16 to provide the resiliency of each contact. However, it is noted that contacts 22a–38a may be designed to act as a spring by contacting the housing, if desired.

Portion 68a has improved electrical performance over the prior art and even the aforementioned contact configuration, due to the shorter contact length. However, the shorter spring is less resilient than contacts with long springs, such as spring portion 68, and therefore may bend after extended and repeated use, resulting in reduced electrical contact.

Additional, advantages of the shorter spring portion include ease of manufacture, since shorter contacts are slightly easier to bend, assemble and control and can allow smaller jack nozes. The shorter contacts require less space below them and, thus, the jack noze can be designed smaller than conventional jack nozes, allowing a better and/or more comfortable fit into a standard keystone opening when designed for a single jack format.

Other than the spring portion, described above the contacts are substantially similar and any description of the contacts described in FIGS. 1–13 is application to the contacts described in FIGS. 14–18.

Furthermore, the same reference numerals are used in FIGS. 14–18 for the elements described in FIGS. 1–13 and those descriptions are applicable for the elements shown in FIGS. 14–18.

While particular embodiments have been chosen to illustrate the invention, it will be understood by those skilled in the art that various changes and modifications can be made therein without departing from the scope of the invention as defined in the appended claims.

What is claimed is:

1. An electrical connector for telecommunications applications, comprising:
   a circuit board;
   a first electrical contact extending from said circuit board along a first path;
   a second electrical contact extending from said circuit board along a second path, said second path crossing said first path;
   a third electrical contact extending from said circuit board along a third path;

a fourth electrical contact extending from said circuit board along a fourth path, said fourth path crossing said third path;

at least four electrical terminals extending from said circuit board, said at least four terminals including a first pair of terminals and a second pair of terminals, said first and second pairs of terminals being adjacent and offset from each other at different distances from a side edge of the circuit board; and at least four electrically conductive traces on said circuit board electrically coupling each of said first, second, third and fourth electrical contacts to a respective one of said electrical terminals.

2. An electrical connector according to claim 1, further comprising a portion of each of said first, second, third and fourth electrical contact being covered by an insulation portion.

3. An electrical connector according to claim 1, further comprising a fifth electrical contact and a sixth electrical contact, said fifth and sixth electrical contacts extending from said circuit board adjacent one another in fifth and sixth paths, respectively.

4. An electrical connector according to claim 3, wherein said fifth path crosses said sixth path.

5. An electrical connector according to claim 3, further comprising a fifth insulation portion and a sixth insulation portion, said fifth and sixth insulation portions substantially covering a portion of said fifth and sixth electrical contacts, respectively, adjacent said circuit board.

6. An electrical connector according to claim 5, further comprising a seventh electrical contact and an eighth electrical contact, said seventh and eighth electrical contacts extending from said circuit board in seventh and eighth paths, respectively.

7. An electrical connector according to claim 6, further comprising a seventh insulation portion and a eighth insulation portion, said seventh and eighth insulation portions substantially covering a portion of said seventh and eighth electrical contacts, respectively, adjacent said circuit board.

8. An electrical connector according to claim 7, wherein said seventh and eighth paths are substantially parallel.

9. An electrical connector according to claim 1, wherein said first, second, third and fourth electrical contacts are encased within a connector housing.

10. An electrical connector according to claim 9, wherein said connector housing is unitary with a second connector housing for a second electrical connector.

11. An electrical connector according to claim 1, wherein said circuit board has first, second, third and fourth apertures therein; and said first, second, third and fourth contacts each have a pin extending therefrom, each of said pins having a first side and a second side, said second side of each of said pins having a lateral protrusion extending therefrom, each of said pins on said first, second, third and fourth contacts being inserted into said first, second, third and fourth apertures, respectively to mount said first, second, third and fourth contacts to said circuit board.

12. An electrical connector according to claim 1, wherein said first, second, third and fourth electrical contacts each have a curved input portion extending forwardly relative to said first, second, third and fourth electrical contacts, respectively, for engaging a respective contact on a plug.

13. An electrical connector according to claim 1, wherein each terminal in each pair extends parallel to each respective terminal in said pair.

14. An electrical connector according to claim 13, wherein said first pair of terminals extends substantially perpendicular to said second pair of terminals.

15. An electrical connector according to claim 1, wherein each electrical terminal in each pair extends linearly to each respective contact in said pair.

16. An electrical connector according to claim 15, wherein said first pair of electrical terminals extends substantially parallel to said second pair of electrical terminals.

17. An electrical connector for telecommunications applications, comprising:

a circuit board;

first, second and third pairs of electrical contacts coupled to said circuit board, a first portion of each of said contacts in each said pair of contacts extending substantially perpendicular to said circuit board, said first portion being arranged for engaging a corresponding plug contact, a second portion of each of said contacts in each said pair of contacts crossing said second portion of a respective contact in each said pair;

at least six terminals extending from said circuit board; and electrically conductive circuit paths on said circuit board electrically coupling each of said contacts to a respective terminal.

18. An electrical connector for telecommunications applications according to claim 17, wherein said first contact of each said first and second and third pairs is mounted adjacent said second contact of the respective pair.

19. An electrical connector for telecommunications applications according to claim 17, further comprising a fourth pair of electrical contacts, said fourth pair of electrical contacts having a first and second electrical contact and said first contact extends substantially perpendicular from said circuit board between the first pair of electrical contacts and said second pair of electrical contacts, and said second electrical contact extends between said second pair of electrical contacts and said third pair of electrical contacts.

20. An electrical connector for telecommunications applications according to claim 17, wherein each electrical contact in each of said pairs of electrical contacts is at least partially covered by an insulation coating.

21. An electrical connector for telecommunications applications, comprising:

a circuit board having a plurality of apertures therein, said apertures each having at least one inner wall;

a plurality of pairs of contacts, each contact in each said plurality of pairs of contacts being mounted in a respective aperture in said circuit board, each said contact having a pin with a first side and a second side, said second side of each pin having a lateral protrusion extending therefrom, each said contact in said plurality of pairs of contacts being mounted to said circuit board when a respective pin is inserted into the respective aperture, at least a portion of said first side of each said respective pin and said lateral protrusion on said second side of each said respective pin frictionally engaging said at least one inner wall of said respective aperture;

a first portion of each of said contacts in each said plurality of pairs of contacts extending substantially perpendicular to said circuit board to engage a corresponding plug contact; and a second portion of each of said contacts in each said plurality of pairs of contacts crossing said second portion of the other contact in each said plurality of pairs of contacts.

22. An electrical connector according to claim 21, wherein insulation coating substantially surrounds said first and second portions of each of said contacts in each said plurality of pairs of contacts.

23. An electrical connector according to claim 22, wherein each contact in said plurality of pairs of contacts is mounted adjacent the other contact of a respective pair.

24. An electrical connector according to claim 22, wherein said insulation coating abuts said circuit board.

* * * * *